US012077392B2

(12) United States Patent
Hashima et al.

(10) Patent No.: US 12,077,392 B2
(45) Date of Patent: Sep. 3, 2024

(54) SUBSTRATE TRANSFER APPARATUS AND SUBSTRATE TRANSFER METHOD

(71) Applicant: Tokyo Electron Limited, Tokyo (JP)

(72) Inventors: Hitoshi Hashima, Kumamoto (JP); Tohru Tochihara, Kumamoto (JP); Michiaki Matsushita, Kumamoto (JP); Hidekazu Kiyama, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 694 days.

(21) Appl. No.: 17/315,423

(22) Filed: May 10, 2021

(65) Prior Publication Data
US 2021/0347584 A1 Nov. 11, 2021

(30) Foreign Application Priority Data

May 11, 2020 (JP) .................................. 2020-083452

(51) Int. Cl.
*B65G 47/90* (2006.01)
*G03F 7/16* (2006.01)
(Continued)

(52) U.S. Cl.
CPC .............. *B65G 47/90* (2013.01); *G03F 7/162* (2013.01); *H01L 21/67766* (2013.01);
(Continued)

(58) Field of Classification Search
CPC ... B65G 47/90; G03F 7/162; H01L 21/67766; H01L 21/6838; H01L 21/68707;
(Continued)

(56) References Cited

U.S. PATENT DOCUMENTS 7,748,760 B2 * 7/2010 Kushida ............ H01L 21/68707
414/941
8,864,202 B1 * 10/2014 Schrameyer ......... B25J 15/0014
294/902
(Continued)

FOREIGN PATENT DOCUMENTS

JP H08-227798 A 9/1996

OTHER PUBLICATIONS

Techiescientist.com, Does Carbon Fiber Conduct Electricity?, Aug. 4, 2021 (https://techiescientist.com/does-carbon-fiber-conduct-electricity/#:~:text=Carbon%20fibers%20are%20good%20conductors%20of%20electricity%20due,to%20form%20carbon%20fibers%20result%20in%20low%20conductance) (Year: 2021).*

*Primary Examiner* — Stephen A Vu
(74) *Attorney, Agent, or Firm* — Venjuris, P.C.

(57) ABSTRACT

A substrate transfer apparatus includes: a non-conductive support with an upper surface that faces a substrate and supports the substrate; a mover that moves the support to transfer the substrate; a connector that connects the support and the mover while being grounded; a conductive contact that is provided on the upper surface of the support, and supports the substrate in contact with a lower surface of the substrate such that the substrate is not brought into contact with the support; a strip-shaped conductive path that is provided to connect the contact and the connector. The strip-shaped conductive path is provided with a bent portion such that an interval of the strip-shaped conductive path formed by the bent portion is at least twice a width of the strip-shaped conductive path.

6 Claims, 12 Drawing Sheets

(51) Int. Cl.
  *H01L 21/677*  (2006.01)
  *H01L 21/683*  (2006.01)
  *H01L 21/687*  (2006.01)
  *H05K 9/00*  (2006.01)

(52) U.S. Cl.
  CPC .... *H01L 21/6838* (2013.01); *H01L 21/68707* (2013.01); *H01L 21/6875* (2013.01); *H05K 9/0067* (2013.01)

(58) Field of Classification Search
  CPC .......... H01L 21/6875; H01L 21/67742; H05K 9/0067; H05F 3/02; B25J 11/0095; B25J 19/06
  See application file for complete search history.

(56) References Cited

U.S. PATENT DOCUMENTS

| | | | |
|---|---|---|---|
| 9,425,076 B2 * | 8/2016 | Agarwal | H01L 21/67766 |
| 10,109,515 B2 * | 10/2018 | Kanazawa | B25J 15/0014 |
| 10,882,192 B2 * | 1/2021 | Cui | B65G 47/91 |
| 2002/0041102 A1 * | 4/2002 | Krauskopf | H01L 21/68707 |
| | | | 294/213 |
| 2012/0049555 A1 * | 3/2012 | Fujii | H01L 21/68707 |
| | | | 294/213 |

\* cited by examiner

SUBSTRATE TRANSFER APPARATUS AND SUBSTRATE TRANSFER METHOD

CROSS-REFERENCE TO RELATED APPLICATIONS

This application is based on and claims priority from Japanese Patent Application No. 2020-083452 filed on May 11, 2020 with the Japan Patent Office, the disclosure of which is incorporated herein in its entirety by reference.

TECHNICAL FIELD

The present disclosure relates to a substrate transfer apparatus and a substrate transfer method.

BACKGROUND

In a process of manufacturing a semiconductor device, for example, various processings such as an application processing in which an application liquid is applied, an exposure processing, and a heating processing are performed on a semiconductor wafer (hereinafter, referred to as a "wafer"), which is a substrate. In order to perform these processings, the wafer is transferred, for example, between modules included in the apparatus, and the transfer is performed by a substrate transfer apparatus configured to support and transfer the substrate using a support.

However, static electricity may accumulate on the wafer during the processings. When an electrostatic discharge (ESD) occurs due to the static electricity, the energy may cause defective parts in the film, the electronic elements, or the electric circuit formed on the wafer. In recent years, the ESD resistance of a semiconductor device has gradually decreased due to the design of the device. Japanese Patent Laid-Open Publication No. H08-227798 discloses a substrate transfer mechanism (e.g., a substrate transfer apparatus) including a support (e.g., a substrate support member) that releases the electric charge of the supported wafer to earth via a conductive material.

SUMMARY

A substrate transfer apparatus according to the present disclosure includes: a non-conductive support having an upper surface that faces a substrate and is configured to support the substrate; a moving mechanism configured to move the support and transfer the substrate; a connector configured to connect the support and the moving mechanism while being grounded; a conductive contact provided on an upper surface of the support, and configured to support the substrate in contact with a lower surface of the substrate such that the substrate is not brought into contact with the support; and a strip-shaped conductive path configured to connect the contact and the connector. The strip-shaped conductive path is provided with a bent portion such that an interval of the strip-shaped conductive path formed by the bent portion is at least twice a width of the strip-shaped conductive path.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawings, which form a part hereof. The illustrative embodiments described in the detailed description, drawings, and claims are not meant to be limiting. Other embodiments may be utilized, and other changes may be made without departing from the spirit or scope of the subject matter presented here.

Figure 1:
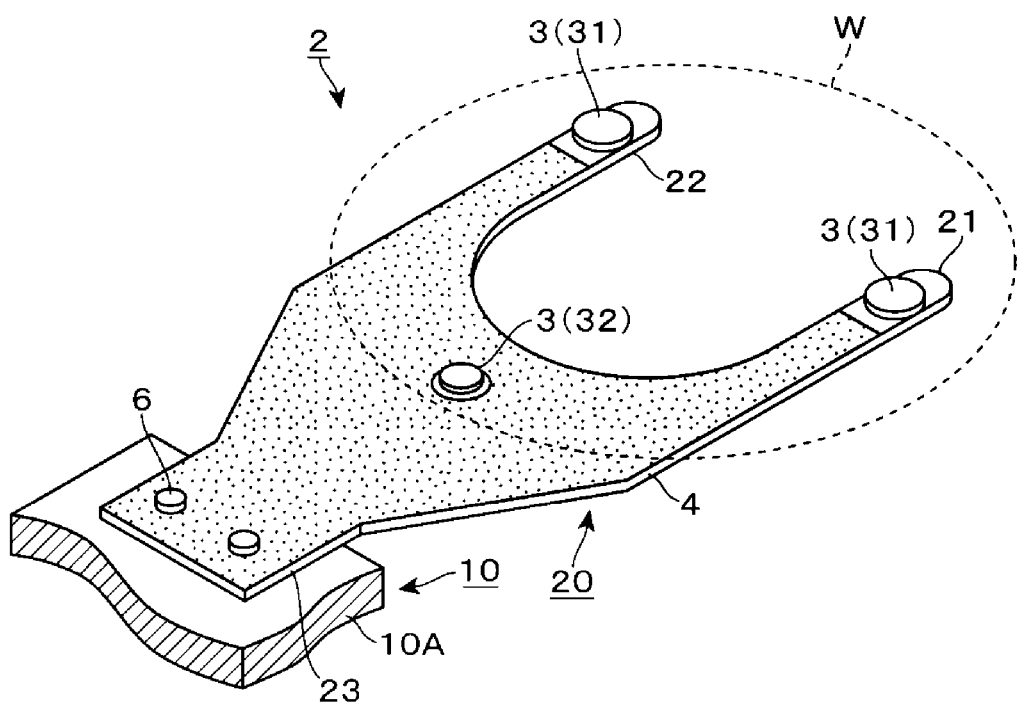
FIG. 1 is a perspective view illustrating a support of a transfer arm.

A substrate transfer apparatus according to the present disclosure will be described. FIG. 1 is a perspective view of a support 20 of a transfer arm 2, which is a substrate transfer apparatus that transfers a semiconductor wafer (hereinafter, referred to as a "wafer"), which is a substrate, in a non-vacuum atmosphere, for example, in an atmospheric atmosphere. The support 20 is a plate-shaped body formed in a bifurcated fork shape, and supports the wafer W in a state where the upper surface of the support faces the back surface of the wafer W from below. The support 20 includes a base 23, and two branches 21 and 22 extending forward from the left and right sides of the base 23, respectively. The support 20 is made of a non-conductive member (e.g., ceramics) so as to obtain high rigidity even if the thickness is relatively thin. Non-conductive refers to having a resistance value of, for example, $10^{12}\Omega$ or more. In the following description of the support 20, the left and the right refers to the left and the right when viewed forward, and the branch 22 is positioned on the left side, the branch 21 is positioned on the right side. The support 20 is bilaterally symmetrically configured.

Figure 2:
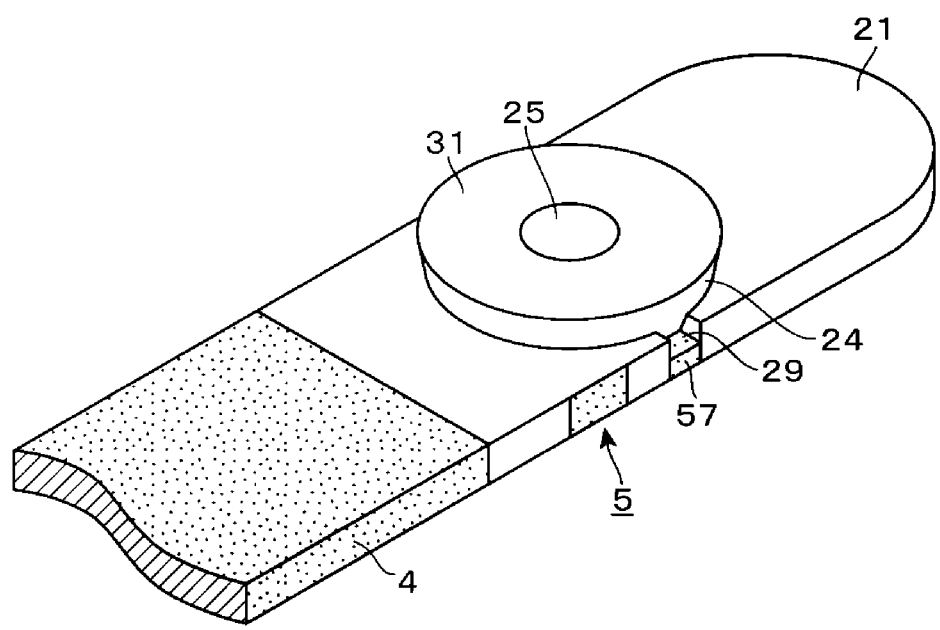
FIG. 2 is an exploded perspective view illustrating a branch of the support.

Descriptions will be continuously made with reference to the perspective view of the branch 21 in FIG. 2. Disc-shaped adsorption pads 3 are provided on tip end sides of the branches 21 and 22 and the base 23 on the upper surface of the support 20, and a lower end portion of the adsorption pad 3 is embedded in a circular recess 24 provided in the support 20. Each adsorption pad 3 is formed of a conductive member such as a conductive resin, and supports the wafer W in a state of being in contact with the back surface of the wafer W and floating from the upper surface of the support 20.

Further, an inner side wall of the recess 24 formed on the tip end sides of the branches 21 and 22 is partially cut off on the left side and on the right side toward outside the recess 24, respectively. As a result, an elongated groove 29 is formed to connect edges of the branches 21 and 22 and the recess 24. A bottom surface of the recess 24 and a bottom surface of the groove 29 form a first surface in which an end portion of a strip-shaped conductive path (to be described later) is formed. Then, the outer sides of the recess 24 and the groove 29 on the upper surface of the support 20 forms a second surface higher than the first surface.

Figure 3:
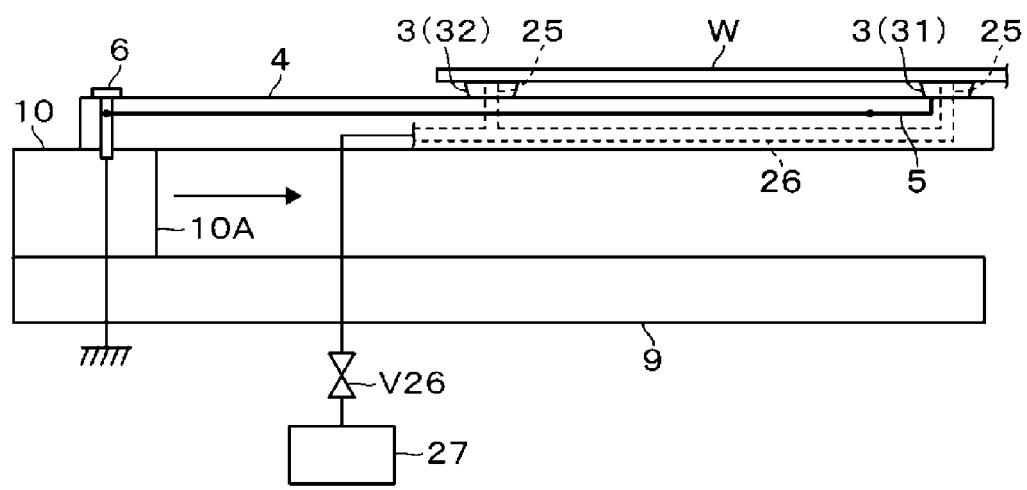
FIG. 3 is a side view illustrating the support.

Each adsorption pad 3 has a shape with a diameter increased toward the upper end side so as to stably support the wafer W, and the wafer W is placed on the upper surface of the adsorption pad 3. Further, a suction hole 25 is opened in the center of the upper surface of the adsorption pad 3. As illustrated in FIG. 3, the suction hole 25 is connected to a suction path 26 formed inside the support 20, and a suction unit 27 is connected to the suction path 26. A valve V26 is interposed in the suction path 26. The suction state and the non-suction state from the suction hole 25 are switched by opening/closing of the valve V26, and when the back surface of the wafer W is placed on each adsorption pad 3, it is switched to the suction state and the wafer W is adsorbed. Regarding the adsorption pads 3, those provided in the branches 21 and 22 may be indicated by a reference numeral 31, and the one provided in the base 23 may be indicated by a reference numeral 32. The adsorption pads 31 and 32 correspond to a contact, and are connected to a conductive path provided in the support 20.

As described in the background art, when static electricity accumulates on the wafer W and ESD occurs, the wafer W may be damaged. The transfer arm 2 is configured to destaticize the wafer W so as to suppress the occurrence of ESD. Specifically, a coating film, which is a conductive member, is formed on the support 20, and is configured as a conductive path that connects the adsorption pad 31 to a ground potential (screw member 6 described later). As described above, a route that has a high rigidity for the support 20 and release static electricity is secured.

However, in a case where the impedance of the conductive path is too low, a steep electric charge transfer from the wafer W to the adsorption pad 31 and to the conductive path formed on the support 20 occurs when the wafer W is placed on the adsorption pad 31. That is, in the conductive path formed in the support 20, a relatively large current flows in a short time, and the peak value of the current becomes large. When an excessive current flows through the conductive path in this manner, the excessive current also flows on the wafer W side to flow into the conductive path. As a result, a large current flows through the circuit formed on the wafer W, and Joule heat generation occurs, which may cause the joint portion of the circuit element that constitutes the circuit to be broken or the wiring film to be melted. Further, a steep potential change occurs in the circuit, and thus, a local electric field is generated, or an oxide film is destroyed. Therefore, in the transfer arm 2, a part of the conductive path is configured as a strip-shaped conductive path 5 so that a sufficient length is secured in the conductive path and an appropriate impedance is obtained. The strip-shaped conductive path 5 is configured to suppress a short circuit between a portion and the other portion of the strip-shaped conductive path 5. Therefore, the resistance value between the upper surface of the adsorption pad 3 and the screw member 6 is, for example, in a range of $1\times10^5\Omega$ or more to less than $1\times10^{12}\Omega$, which is a range where a proper static electricity elimination is expected, and specifically, for example, is in a range of $1\times10^7\Omega$ to $9.9\times10^9\Omega$.

As illustrated in FIG. 1, the surface of the support 20 excluding the tip end portion of each of the branches 21 and 22, and the periphery of the adsorption pad 32 is coated with, for example, a coating portion 4, which is a coating film that constitutes the conductive member. Specifically, the coating portion 4 is made of, for example, a conductive fluororesin. Therefore, the periphery of the adsorption pad 32 is surrounded by the coating portion 4, and the adsorption pad 32 is insulated from the coating portion 4. Then, the coating portion 4 is also formed in the branches 21 and 22, but the edge of the coating portion 4 on the front side is positioned behind the adsorption pad 31.

The edge of the coating portion 4 on the front side and the adsorption pad 3 (31) are connected with each other via the strip-shaped conductive path 5 formed as a coating film of the conductive member, similarly to the coating portion 4. The strip-shaped conductive path 5 refers to a single strip-shaped conductive path that is not branched in the middle. In the drawings, the coating portion 4 and the strip-shaped conductive path 5 are indicated by dots.

Before describing the strip-shaped conductive path 5 in detail, the configuration of each other portions of the transfer arm 2 will be described with reference to FIG. 3. The transfer arm 2 slides the support 20, for example, in the front-rear direction, and includes a moving body 10, which is a moving mechanism that moves on a base 9. Although not illustrated, the transfer arm 2 includes a rotation mechanism that rotates the base 9 around the vertical axis and an elevation mechanism that moves the rotation mechanism up and down along the vertical direction, and is configured to transfer the wafer W between each of the modules of the apparatus (to be described later).

The support 20 is connected to the moving body 10 via the screw member 6, which is a conductive connecting unit provided to be conductive with the coating portion 4. A case 10A that constitutes the moving body 10 is made of, for example, a conductive material, and is connected to the ground potential. Therefore, as schematically illustrated in FIG. 3, the conductive path that flows through the wafer W, the adsorption pad 31, the strip-shaped conductive path 5, the coating portion 4, the screw member 6, and the case 10A of the moving body 10, and is connected to the ground potential is formed.

A configuration of the strip-shaped conductive path 5 according to the present disclosure will be described with reference to FIGS. 4 and 5. The strip-shaped conductive path 5 is provided in the tip end of each of the branches 21 and 22. When the extending directions of the branches 21 and 22 are forward, the respective strip-shaped conductive paths 5 are formed mirror-symmetrically with respect to an axis extending in the front-rear direction. Therefore, here, a configuration of the strip-shaped conductive path 5 formed on the branch 21 on the right side will be described.

Figure 4:
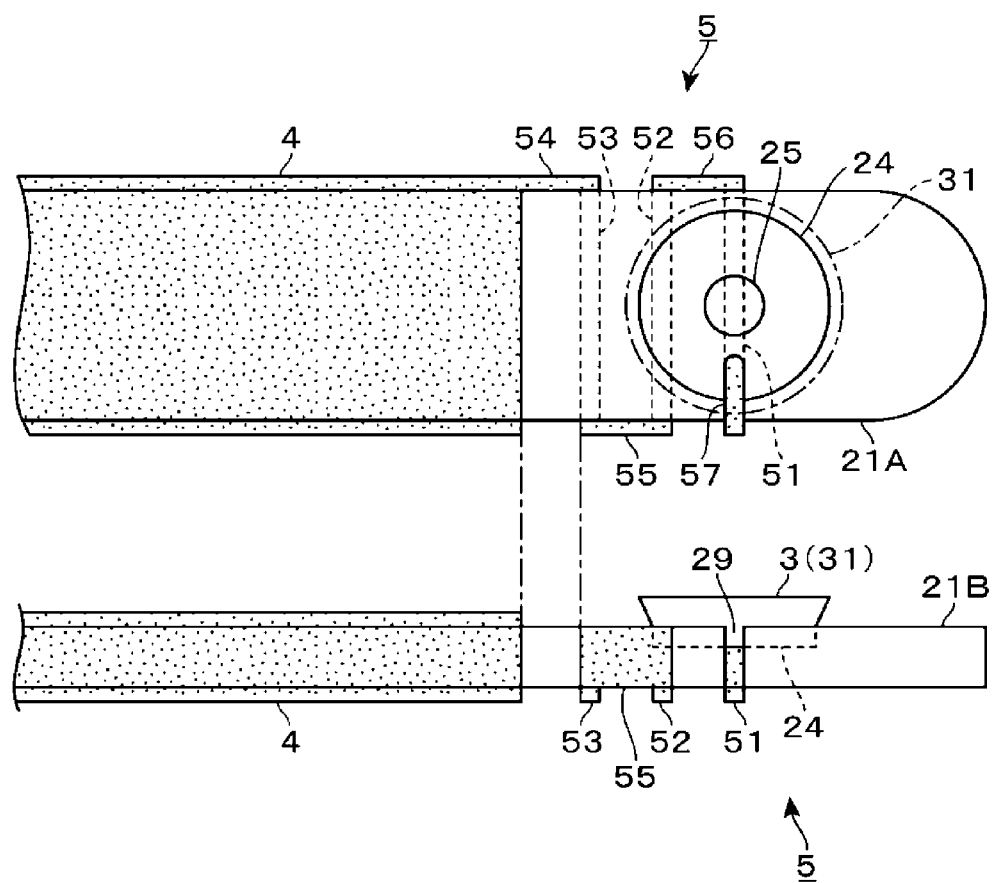
FIG. 4 is a top and side view of a branch.
Figure 5:
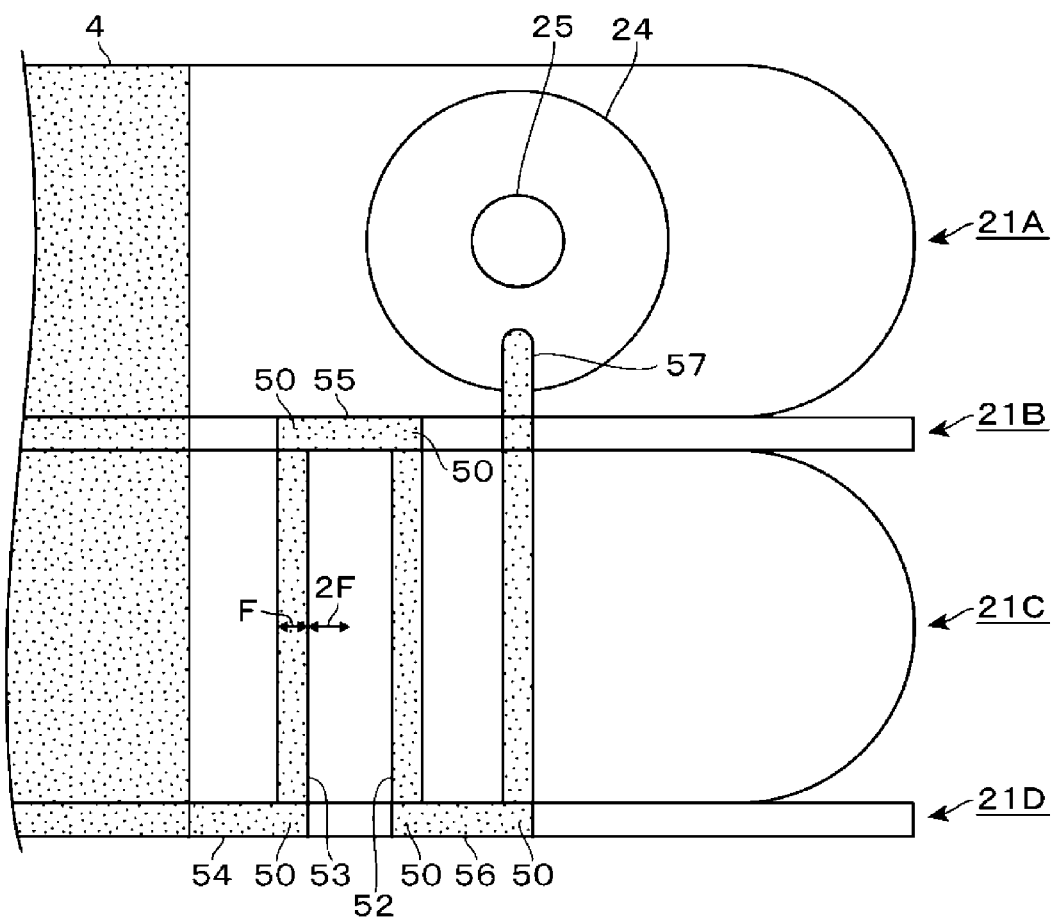
FIG. 5 is a development view in which a branch is developed in a plane.

FIG. 4 illustrates an upper surface and a right side surface of the branch 21, and FIG. 5 illustrates a development view in which the tip end portion of the branch 21 is developed in a plane. In FIG. 5, the recess 24 formed on the upper surface of the support 20 is not illustrated and the upper surface side is illustrated as a flat surface, and the thicknesses of the coating portion 4 and the strip-shaped conductive path 5 are ignored. In FIGS. 4 and 5, the upper surface of the branch 21 is indicated by a reference numeral 21A, the right side surface is indicated by a reference numeral 21B, the lower surface is indicated by a reference numeral 21C, and the left side surface is indicated by a reference numeral 21D.

As illustrated in FIGS. 4 and 5, the strip-shaped conductive path 5 is provided by drawing around one strip-shaped conductive path over the four surfaces of the upper surface 21A (specifically, the recess 24 and the bottom surface of the groove 29), and the lower surface 21C of the branch 21, and the left and right side surfaces 21B and 21D of the branch 21. On the lower surface 21C of the branch 21, three conductive paths 51 to 53 extending in the left-right direction are formed to be arranged at an equal interval in the front-rear direction. Assuming that the three conductive paths are front-stage, middle-stage, and rear-stage conductive paths 51 to 53 from the front side, the coating portion 4 and the rear-stage conductive path 53 are connected with each other by a conductive path 54 provided on the left side surface 21D of the branch 21. Further, the rear-stage conductive path 53 and the middle-stage conductive path 52 are connected with each other by a conductive path 55 provided on the right side surface 21B of the branch 21. Further, the middle-stage conductive path 52 and the front-stage conductive path 51 are connected with each other by a conductive path 56 provided on the left side surface 21D of the branch 21. The conductive paths 54 to 56 provided on the right side surface 21B or the left side surface 21D are formed to extend on each side surface in the front-rear direction.

Further, a conductive path 57 having a tip end drawn around the bottom surface of the recess 24 is connected to the right side end portion of the front-stage conductive path 51 via the right side surface 21B of the branch 21 and the bottom surface of the groove 29. Then, the conductive path 57 drawn around the bottom surface of the recess 24 and the lower surface of the adsorption pad 31 are connected with each other via a conductive adhesive (not illustrated). Therefore, on the outer side of the adsorption pad 31A on the upper surface 21A of the branch 21, the strip-shaped conductive path 5 is provided on the bottom surface of the groove 29.

Then, as illustrated in FIG. 5, the strip-shaped conductive path 5 is formed as a conductive pattern that meanders repeatedly so as to be formed into a periodic rectangular wave shape by bending one conductive path from the coating portion 4 toward the tip end direction of the branch 21 a plurality of times in the left-right direction. As a result, the strip-shaped conductive path 5 includes a plurality of bent portions 50. The bent portion 50 refers to a portion that is bent when the conductive path is developed in a plane. Portions bent along the outer shape of the support 20 by simply forming a linear-shape conductive path over different surfaces are not included in the bent portion 50. Further, in the strip-shaped conductive path 5, the widths of the respective portions are the same from the location in contact with the adsorption pad 31 to the location connected to the coating portion 4, and the size thereof is indicated as F in the drawing. The conductive paths 51 to 57 are disposed at intervals of 2F or more from each other. In this example, the width F of the strip-shaped conductive path 5 is the thickness of the branch 21.

As described above, by providing the strip-shaped conductive path 5 including the bent portion 50 between the adsorption pad 31 and the screw member 6, the length of the conductive path between the upper surface of the adsorption pad 31 and the screw member 6 becomes appropriate, and thus, the impedance of the conductive path becomes appropriate. Then, when the strip-shaped conductive path 5 including the bent portion 50 as described above, the width of the strip-shaped conductive path 5 and each portion of the strip-shaped conductive path 5 are configured to have the above relationship. A short circuit between one portion and the other portion in the strip-shaped conductive path 5 is suppressed by providing the configuration as described above. That is, it is possible to suppress discharge from being caused as, when a short circuit occurs, the impedance and the resistance value of the conductive path deviate from the desired range, and an excessive current flows through the conductive path. The width of the strip-shaped conductive path 5 and the interval between the respective portions will be described in more detail later with reference to other examples.

Figure 6:
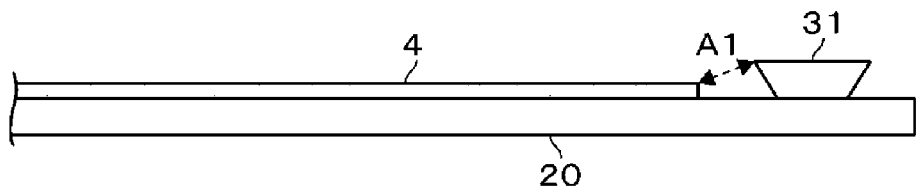
FIG. 6 is an explanatory view illustrating an interval between a contact and a cover.

Further, as a supplement, for the purpose of suppressing a short circuit in the conductive path provided in the support 20 as described above, the interval between the conductive path 53 that constitutes the strip-shaped conductive path 5 and the coating film 4 has a size of 2F or more (at least twice the width F of the strip-shaped conductive path 5) on the lower surface 21C of the branch 21. Then, as illustrated in FIG. 6, on the upper surface 21A of the branch 21, an interval A1 formed by the edge of the coating portion 4 and the adsorption pad 31 has also a size of 2F or more in order to suppress a short circuit in the conductive path as described above. Further, even when the coating film portion 4 is provided below the upper surface of the adsorption pad 31, the interval between the adsorption pad 31 and the surface of the coating film portion 4 may have a size of 2F or more, similarly to the above interval A1. Specifically, the interval A1 is, for example, 4 mm or more. An appropriate value of the distance of the interval A1 may be varied according to a charge level of the allowable target of the wafer W.

An action of the transfer arm 2 according to the present disclosure will be described. The support 20 of the transfer arm 2 is raised from the lower side of the charged wafer W, and as illustrated in FIG. 3, the wafer W is horizontally supported so as to be in contact with the three adsorption pads 3 (31 and 32) and thus, is adsorbed on the adsorption pad 3. The electric charge of the wafer W is transferred to the adsorption pad 31, the conductive coating film (strip-shaped conductive path 5 and the coating portion 4), and the screw member 6 in this order, and the wafer W is destaticized.

By providing the strip-shaped conductive path 5 that constitutes the conductive coating film as described above, the impedance between the adsorption pad 31 and the screw member 6 becomes an appropriate value, and the short circuit between a portion and the other portion of the strip-shaped conductive path 5 is suppressed. Therefore, the occurrence of the excessive current is prevented. As a result, it is possible to suppress the excessive current from flowing through the wafer W, and thus, the occurrence of damage to the wafer W is suppressed.

Figure 7:
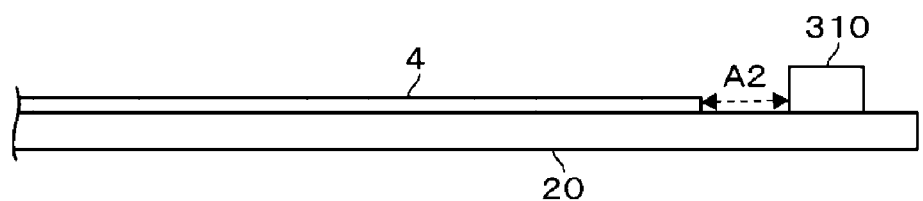
FIG. 7 is an explanatory view illustrating an interval between a contact and a cover.

When the wafer W is destaticized as described above, the short circuit between the coating portion 4 and the adsorption pad 31 is suppressed by setting the interval between the coating portion 4 and the adsorption pad 31 to 2F or more as described above with reference to FIG. 6. As a supplement with respect to the positional relationship between the coating portion 4 and the adsorption pad 31, the interval formed by the coating portion 4 and the adsorption pad 31 is, more specifically, the minimum interval between these members. Specifically, as described above, since the adsorption pad 31 widens as it goes upward, the interval A1 between the upper end of the adsorption pad 31 and the edge of the coating portion 4 is the minimum interval between these members, and thus, the interval A1 becomes 2F or more. However, as illustrated in FIG. 7, when an adsorption pad 310 is a cylinder provided with a vertical wall, the lower end of the adsorption pad 310 is closest to the edge of the coating portion 4, and thus, an interval A2 between the lower end and the edge of the coating portion 4 becomes 2F or more.

However, if the supported wafer W is warped, it is considered that the wafer W comes into contact with the support 20. As the region of the strip-shaped conductive path 5 formed on the upper surface of the support 20 increases, there is a higher risk that the strip-shaped conductive path 5 is damaged due to wear or peeling caused by the contact with the wafer W. The resistance value of the strip-shaped conductive path 5 is defined according to the width, if the wear or the peeling is proceeded and the connection to the screw member 6 is cut off, the function may be remarkably damaged.

In the strip-shaped conductive path 5, any damage to the strip-shaped conductive path 5 caused by the contact with the wafer W may be suppressed by providing the conductive path 57 that constitutes the end portion of the strip-shaped conductive path 5 on the upper surface of the support 20. That is, by disposing the end portion of the strip-shaped conductive path 5 on the upper surface of the support 20, the increase in the peak value of the current flowing between the adsorption pad 31 and the screw member 6 may be more reliably suppressed.

Further, due to the elasticity and the rigidity of the substrate such as a silicon substrate or a glass substrate, here, the wafer W, supported on the upper surface of the adsorption pad 31, the conductive path 57 forming the end portion may be disposed sufficiently inside from the range where the wafer W may be warped to the extent that the wafer W comes into contact with the conductive path 57 from the upper surface of the pad. In other words, the conductive path 57 forming the end portion of the strip-shaped conductive path 5 may be provided at a position within a range that does not come into contact with the supported wafer W with reference to the adsorption pad 31.

Further, the conductive path 57 is formed on the bottom surface of the groove 29 provided on the surface 21A of the branches 21 and 22. Therefore, since the distance between the upper edge of the adsorption pad 31 and the conductive path 57 is relatively long, when the wafer W is destaticized as described above, the short circuit between the upper edge and the strip-shaped conductive path 5 is suppressed. Therefore, it is possible to more reliably suppress the increase in the peak value of the current flowing between the adsorption pad 3 and the screw member 6 as described above. Further, when the wafer W is received, although the support 20 is raised and approaches the back surface of the wafer W, the wafer W and the conductive path 57 are relatively far apart from each other at that time, and thus, the short circuit from the wafer W to the conductive path 57 may be suppressed.

Figure 8:
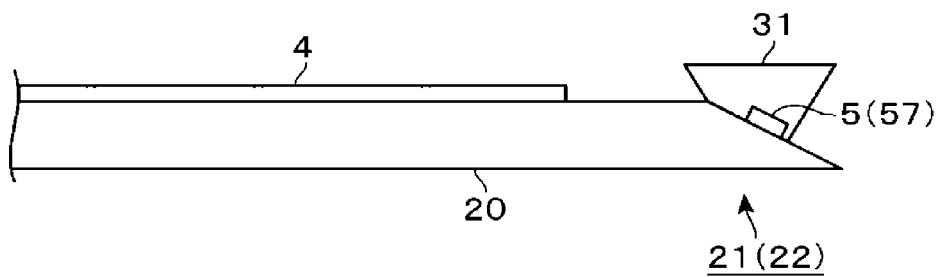
FIG. 8 is an explanatory view illustrating another example of a support.

In order to increase the distance between the conductive path 57 and the adsorption pad 31 as described above, it is not limited to form the conductive path 57 in the groove 29 (recess 24). As illustrated in FIG. 8, the surface of the tip end portion of the branch 21 (22) may be configured as an inclined surface, and the conductive path 57 of the strip-shaped conductive path 5 may be formed on the inclined surface.

However, when the wafer W is warped as described above, it is considered that the wafer W comes into contact with the support 20. As the region of the strip-shaped conductive path 5 formed on the upper surface of the support 20 increases, there is a higher risk that the strip-shaped conductive path 5 is damaged due to the contact with the wafer W. The strip-shaped conductive path 5 may be formed on the side surface and the lower surface of the branch 21 as described above, since it contributes to securing an appropriate length of the strip-shaped conductive path 5 while reducing the risk.

For example, the strip-shaped conductive path 5 is formed by forming a film serving as the conductive path after masking a portion of the branches 21 and 22. In order to form the strip-shaped conductive path 5 as described above, a linear shape mask pattern may be formed on each of the lower surface 21C, the side surface 21B, and the side surface 21D of the branch 21. That is, when the strip-shaped conductive path 5 is formed on the lower surface 21C without using the side surfaces of the branches 21 and 22, the mask pattern becomes complicated with bent portion. However, the mask pattern may be simplified by forming the strip-shaped conductive path 5 using the side surfaces of the branch 21 as described above. That is, it may be advantageous that the support 20 is easily manufactured by forming a part of the strip-shaped conductive path 5 on the side surfaces of the branch 21.

Further, when the strip-shaped conductive path 5 is formed using the side surfaces 21B and 21D in addition to the lower surface 21C of the branches 21 and 22, the strip-shaped conductive path 5 having a sufficient length may be formed, for example, for the transfer arm 2 in which the distance between the adsorption pad 31 and the screw member 6 is relatively short. Then, therefore, the impedance between the adsorption pad 31 and the screw member 6 may become appropriate. Therefore, forming the strip-shaped conductive path 5 on the side surfaces of the branches 21 and 22 contributes to the high degree of freedom in the layout of the adsorption pad 3 (31).

The strip-shaped conductive path 5 may be provided in either one of the branches 21 and 22. Further, the adsorption pad 32 on the base 23 side of the support 20 illustrated in FIG. 1 may be connected to one end of the strip-shaped conductive path 5 having the pattern shape illustrated in FIG. 5, and the other end of the strip-shaped conductive path 5 may be connected to the coating portion 4. That is, at least any one of two adsorption pads 31 and one adsorption pad 32 may be connected to the screw member 6 via the strip-shaped conductive path 5 and the coating portion 4.

Subsequently, other examples of the strip-shaped conductive path 5 will be described with reference to FIGS. 9 to 12. FIGS. 9 to 12 illustrate the drawings in which strip-shaped conductive paths 5A to 5D are developed in a plane, and the strip-shaped conductive path 5A to 5D may be formed over a plurality of surfaces of the support 20, or may be formed on one surface thereof.

Figure 9:
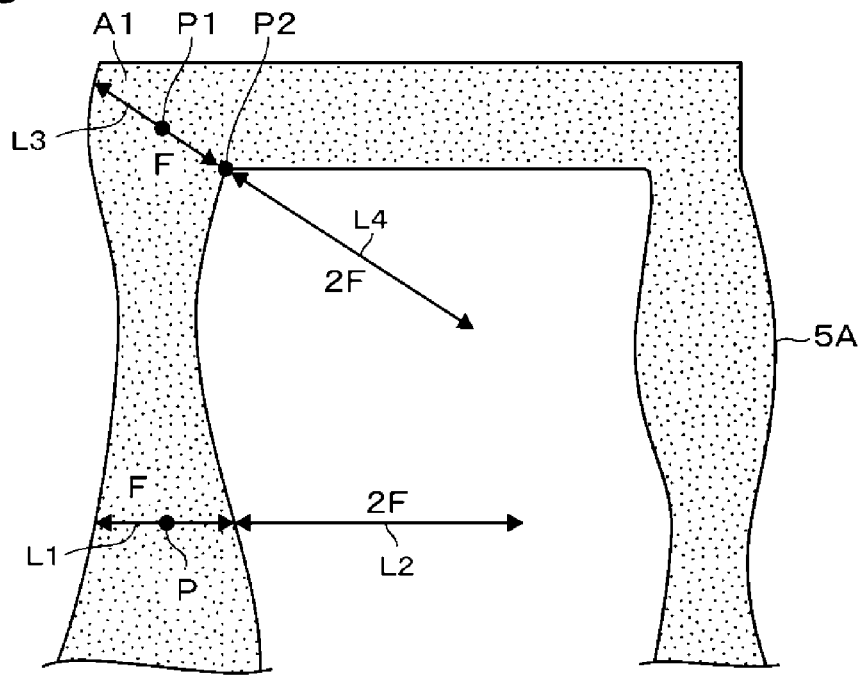
FIG. 9 is a development view illustrating another example of a strip-shaped conductive path.

As illustrated as the strip-shaped conductive path 5A in FIG. 9, the strip-shaped conductive path may be different in the width of each portion. The relationship between the width of the strip-shaped conductive path and the interval between each portion will be described in detail with reference to FIG. 9. When looking at a point P in the strip-shaped conductive path, a line L1 orthogonal to the forming direction of the conductive path is drawn from one end of the conductive path to the other end thereof. The length of the line L1 is the width F at the point P of the conductive path. An extension line L2 with respect to the line L1 is drawn such that the length is 2F. The extension line L2 may not be in contact with the strip-shaped conductive path. Then, the strip-shaped conductive path 5A in FIG. 9 and the strip-shaped conductive path 5 in FIG. 5 are bent at a right angle. Since the line L1, which indicates the width, may not be drawn in the bent portion 50 (since, if the line is drawn, the line becomes a line indicating the longitudinal direction of the strip-shaped conductive path), it may be sufficient that the location other than such bent portion 50 satisfies the relationship of the interval of 2F or more with respect to the width F.

Figure 10:
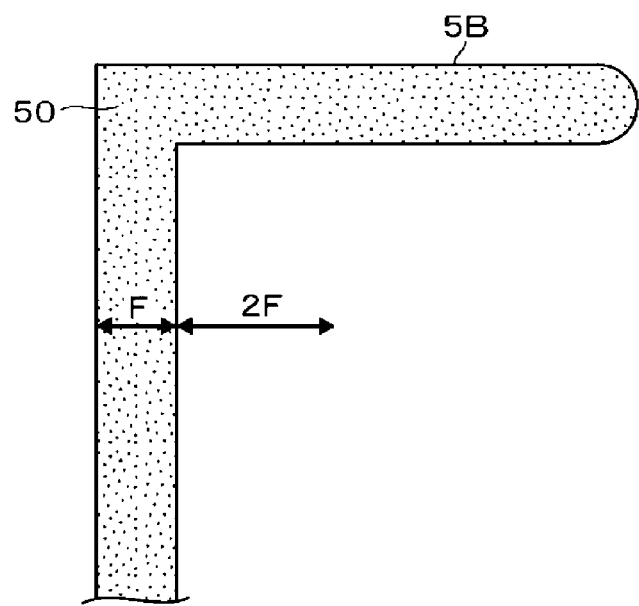
FIG. 10 is a development view illustrating another example of a strip-shaped conductive path.
Figure 11:
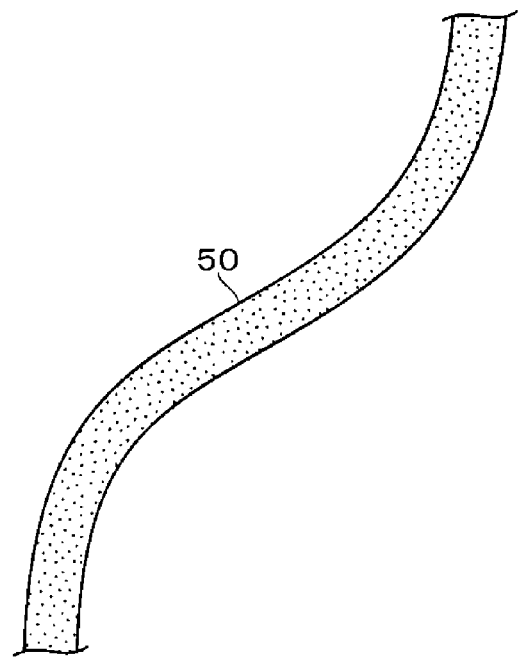
FIG. 11 is a development view illustrating another example of a strip-shaped conductive path.
Figure 12:
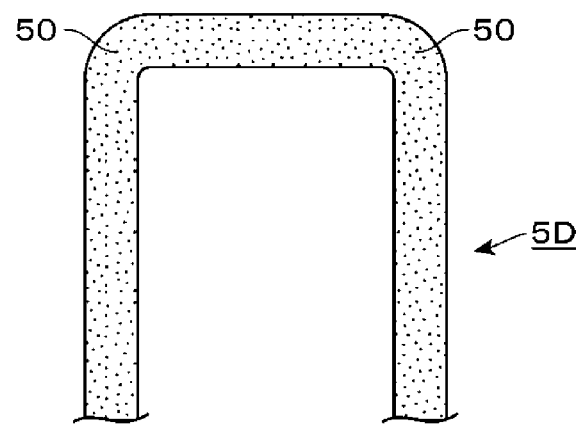
FIG. 12 is a development view illustrating another example of a strip-shaped conductive path.

Further, when the extension line L2 with respect to the line L1 is drawn such that the length is 2F, since the extension line L2 may not be in contact with the strip-shaped conductive path 5, as illustrated in FIG. 10, the strip-shaped conductive path 5B may be formed to have one bent portion 50. Further, as illustrated in FIG. 11, the strip-shaped conductive path 5C having an S shape may be used. That is, when the strip-shaped conductive path 5C is developed in a plane, the configuration does not have to be a folded configuration. Further, as illustrated in FIG. 12, the bent portion 50 of the strip-shaped conductive path 5D may be formed in an arc shape.

Figure 13:
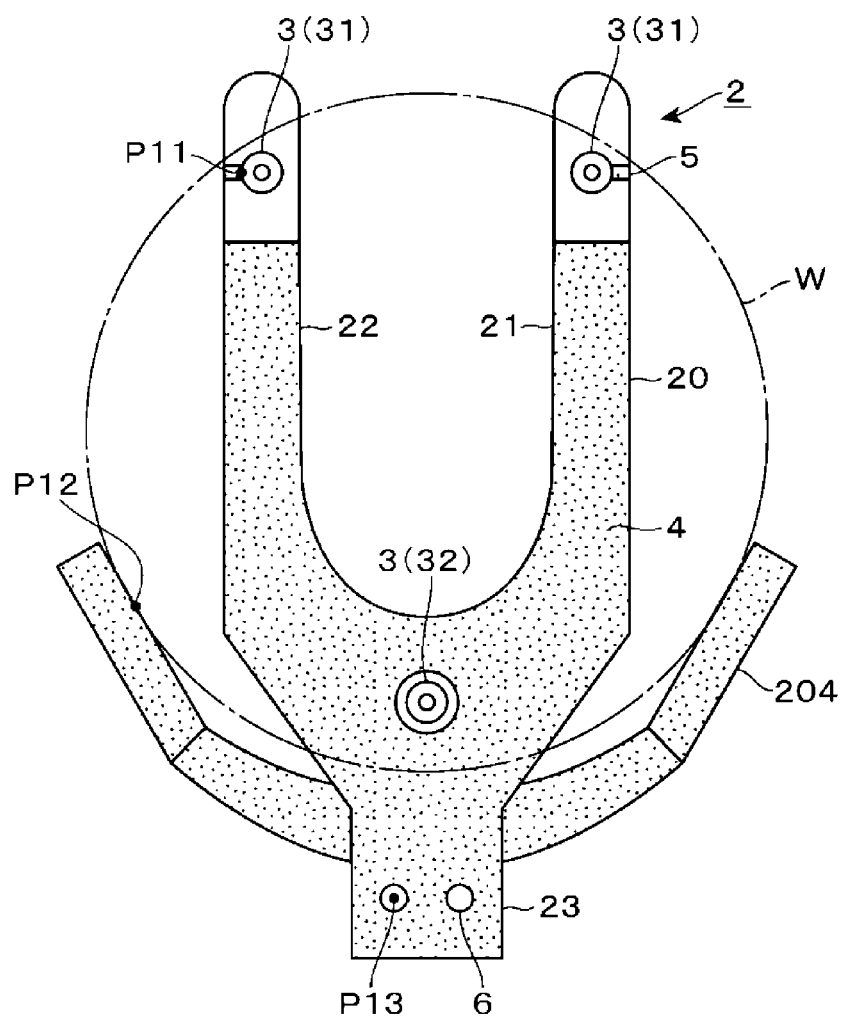
FIG. 13 is a plan view illustrating another example of a support.

Further, FIG. 13 illustrates another example of the transfer arm 2. In this example, a guide 204 configured to perform positioning of the wafer W is provided in the support 20 illustrated in FIG. 1. The guide 204 is provided to extend, for example, from the left and right sides of the base 23 of the support 20 to the outside of the peripheral edge (side wall) of the wafer W supported by the support 20, respectively. Although details will be described when the other supports described later are described, the guide 204 comes into contact with the peripheral edge of the wafer W, and achieves a role of alignment for positioning of the wafer W. The guide 204 is formed by, for example, a conductive member such as a conductive resin. Since the guide 204 is in contact with the base 23, the surface of the guide 204 is electrically connected to the screw member 6 via the coating film 4 of the base 23.

However, when discharge occurs from an arbitrary member, the discharge is likely to occur from a pointed portion of the member. Therefore, the discharge from the charged wafer W is likely to occur from the peripheral edge of the wafer W where corners are present, as compared with the central side, which is a planar body. Therefore, when the support 20 is brought into contact with the wafer W in order to receive the charged wafer W, discharge from the wafer W to the guide 204 is relatively likely to occur. However, the strip-shaped conductive path 5 is provided in the conductive path between the adsorption pad 31 and the screw member 6 as described above, and thus, the impedance of the conductive path is adjusted to be appropriate. That is, when the electric charge is mainly transferred from the guide 204 to the screw member 6 when receiving the wafer W, the peak value of the current flowing on the surface of the support 20 becomes large, and the strip-shaped conductive path 5 may not sufficiently perform the role.

Therefore, a resistance value R1 of the conductive path between the guide 204 and the screw member 6 is configured to be higher than a resistance value R2 of the conductive path between the adsorption pad 31 and the screw member 6. Therefore, when the charged wafer W is received on the support 20, the guide 204 approaches the peripheral edge of the wafer W and the adsorption pad 31 approaches the back surface of the wafer W, and the electric charge of the wafer W is transferred to the conductive path via the adsorption pad 31, which is easier to flow through. Therefore, the peak current value is suppressed as described above, and thus the occurrence of the discharge is suppressed.

The resistance value between the guide 204 and the screw member 6 and the resistance value between the adsorption pad 31 and the screw member 6 are changed when the measurement position in each portion is different, and thus, the resistance values will be described in detail. The resistance value between the guide 204 and the screw member 6 is a resistance value of the path where the resistance value is the lowest between the contact position in the guide 204 with the wafer W and the screw member 6. Therefore, in this example, a plurality of screw members 6 is provided, and the resistance value is the resistance value between the screw member 6 closest to the contact position in the guide 204 with the wafer W among the plurality of screw members 6 and the contact position, and specifically, the resistance value between P12 and P13 in the drawing. Further, the contact position in the guide 204 with the wafer W refers to the contact position of the wafer W in designing. That is, the contact position is the position designed to come into contact with the wafer W on the surface of the guide 204 when the wafer W, which is a transfer target, is not warped.

In the same way, the resistance value between the adsorption pad 3 (31) and the screw member 6 is the resistance value of the path where the resistance value is the lowest between the contact position (i.e., position on the upper surface) in the adsorption pad 31 with the wafer W and the screw member 6, and specifically, the resistance value between P11 and P13 in the drawing. Therefore, the resistance value R2 between P11 and P13 is smaller than the resistance value R1 between P12 and P13.

As described above, although the guide 204 is formed by a conductive member such that the resistance value is R2<R1, for example, the guide 204 may be formed by an insulating member and include a pattern by a conductive member to electrically connect the wafer W and the screw member 6 with each other. As the conductive pattern, the strip-shaped conductive path 5 including the bent portion 50 described with reference to FIGS. 4 and 5 may be provided.

When the guide 204 is made of a non-conductive material, and the surface thereof is not destaticized, the guide 204 may be charged and attract particles, and then, the attracted particles may adhere to the wafer W. Therefore, in order to suppress particle contamination of the wafer W, as described above, the guide 204 may be formed by the conductive member, and may be connected to the ground potential to be destaticized.

Figure 14:
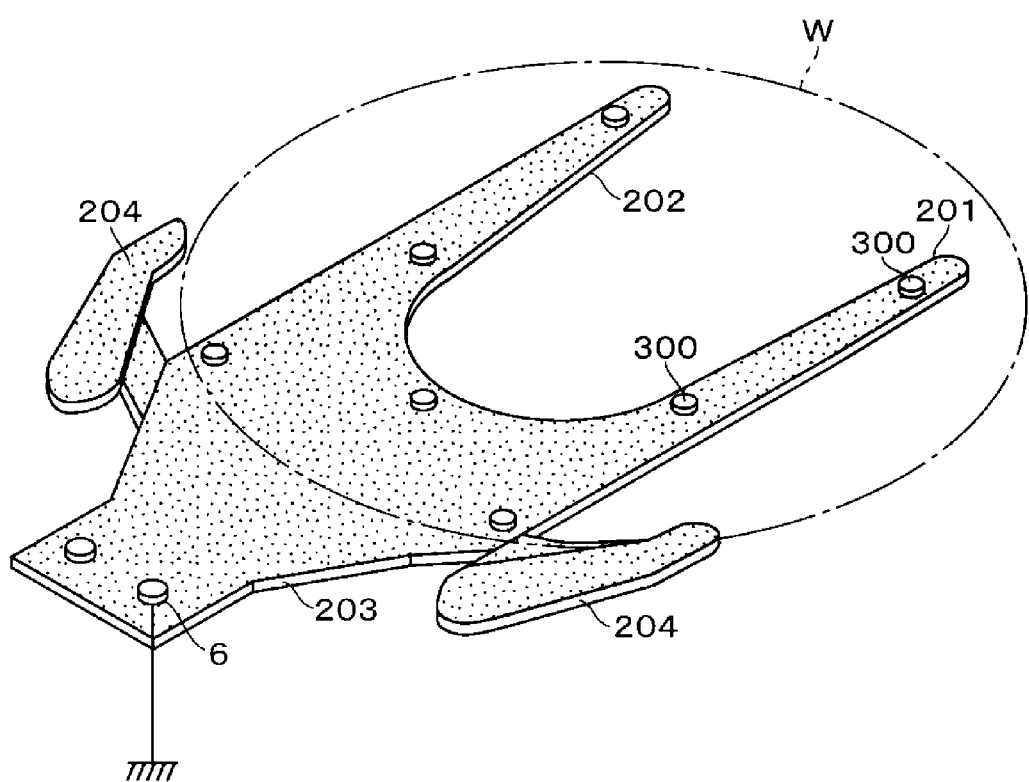
FIG. 14 is a perspective view illustrating another example of a support.

Further, FIG. 14 illustrates a support 200 provided with a gap pin 300 which is a conductive contact protruding from the surface of the support 200, instead of the adsorption pad 3. In the support 200, the outer region of the gap pin 300 is covered with the coating portion 4, and the lower end portion of the gap pin 300 is electrically connected to the coating portion 4. Therefore, the wafer W supported on the gap pin 300 is destaticized, similarly to the wafer W supported by the adsorption pad 3. In the support 200 of the transfer arm 2, a plurality of gap pins 300 is dispersively provided in tip end portions 201 and 202 and a base 203.

Further, the support 200 includes the guide 204 which is the same as in the support 20 illustrated in FIG. 13, and is destaticized by being brought into contact with the guide 204. As a supplement with respect to the guide 204, the support 200 in a state of supporting the wafer W is moved forward on the base 9. At this time, the wafer W that tries stop at that place comes into contact with the guide 204 and is pressed due to inertia. Therefore, the wafer W is suppressed from falling from the support 200, and the positioning on the support 200 is performed. The support 20 provided with the adsorption pad 3 illustrated in FIG. 13 may perform such positioning in a state where the suction from the adsorption pad 3 is stopped.

Figure 15:
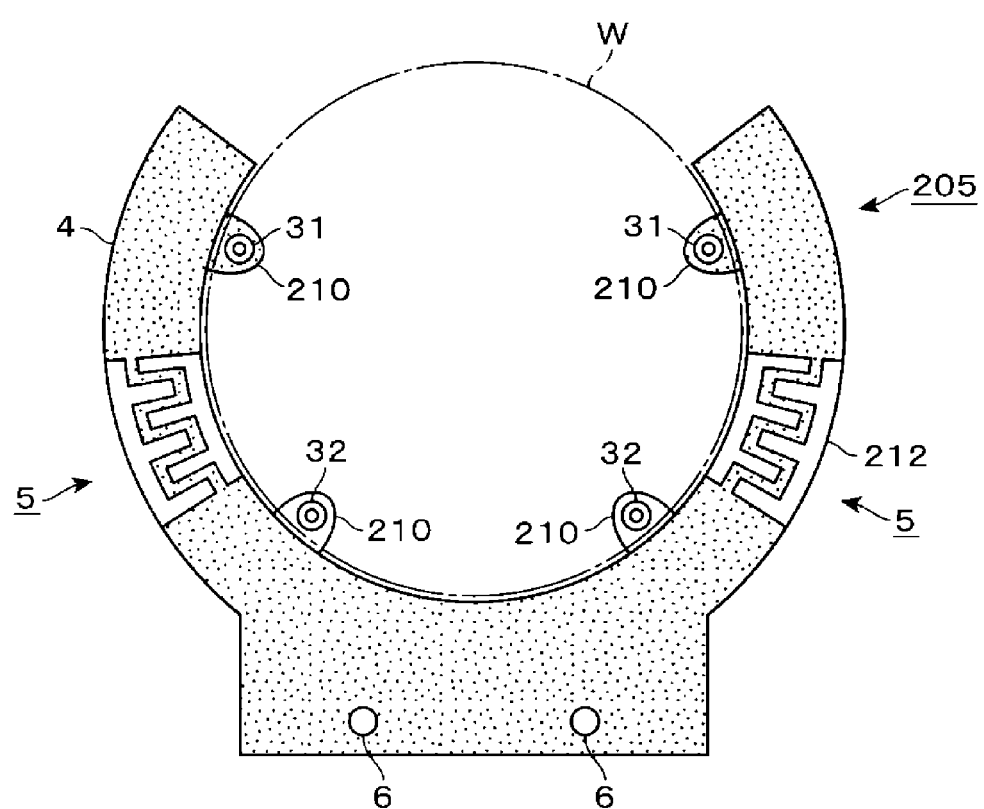
FIG. 15 is a plan view illustrating another example of a support.

However, the upper surface of each of the supports 20 and 200 faces the wafer W from below, but may not be parallel with the wafer W, and may be oblique to the back surface of the wafer W. Then, the strip-shaped conductive path 5 is provided in the support 20 that faces the wafer W as described above in the respective examples, but the strip-shaped conductive path 5 is not limited to be provided in such member. In an example of a transfer arm 205 illustrated in FIG. 15, a plurality of supports 210 including the adsorption pads 31 and 32 is provided, and is connected to an inner circumference of an arc-shaped surrounding portion 212 that surrounds the side circumference of the wafer W. The surrounding portion 212 is connected to the moving body 10 (not illustrated in FIG. 15) via the screw member 6. The support 210 provided with the adsorption pad 31 and the surrounding portion 212 are coated with the conductive coating portion 4 in the same manner as in the support 20, and the adsorption pad 31 and the screw member 6 are electrically connected with each other via the coating portion 4. With respect to the coating portion 4, the coating film on the upper surface of the surrounding portion 212 is configured as the strip-shaped conductive path 5 having a plurality of bent portions 50 as described with reference to FIG. 5. That is, the strip-shaped conductive path 5 is not limited to be provided in the member facing the wafer W.

Figure 16:
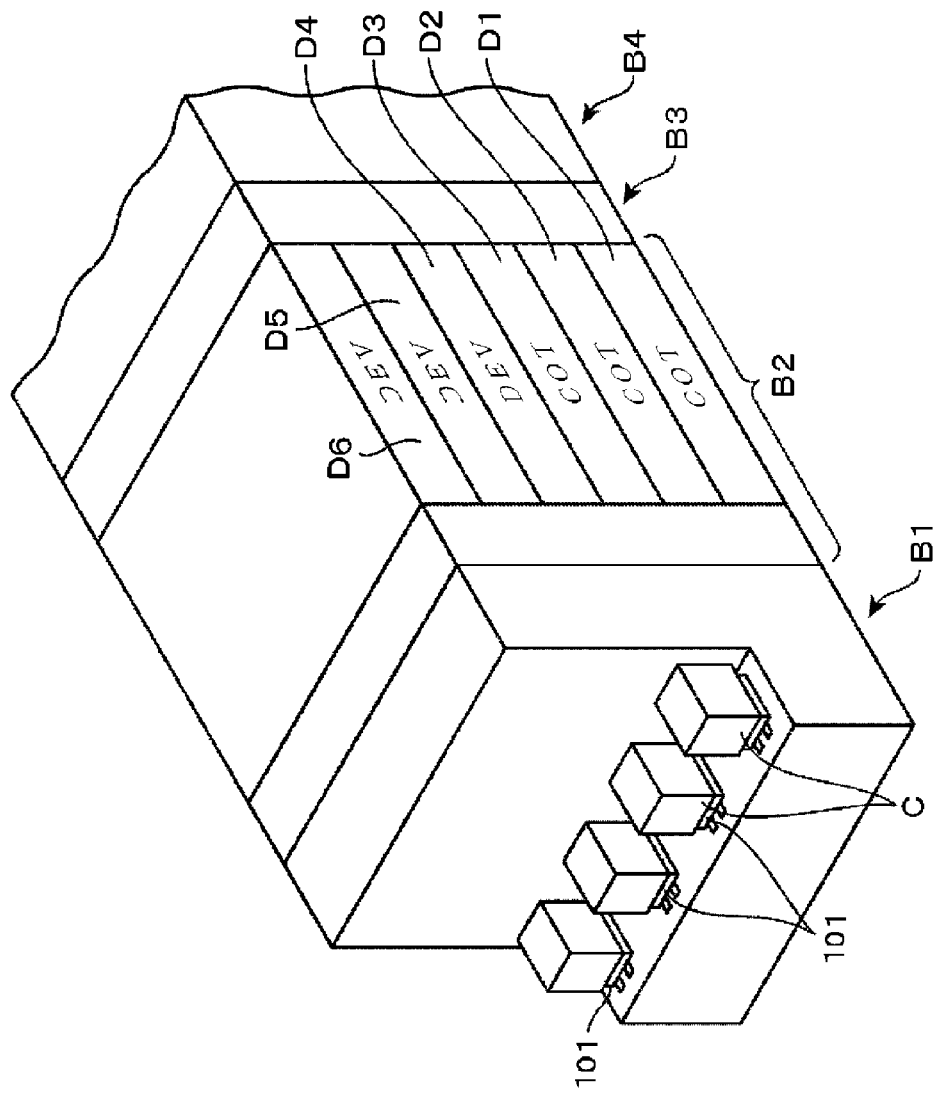
FIG. 16 is a longitudinal sectional view illustrating an application and development apparatus.
Figure 17:
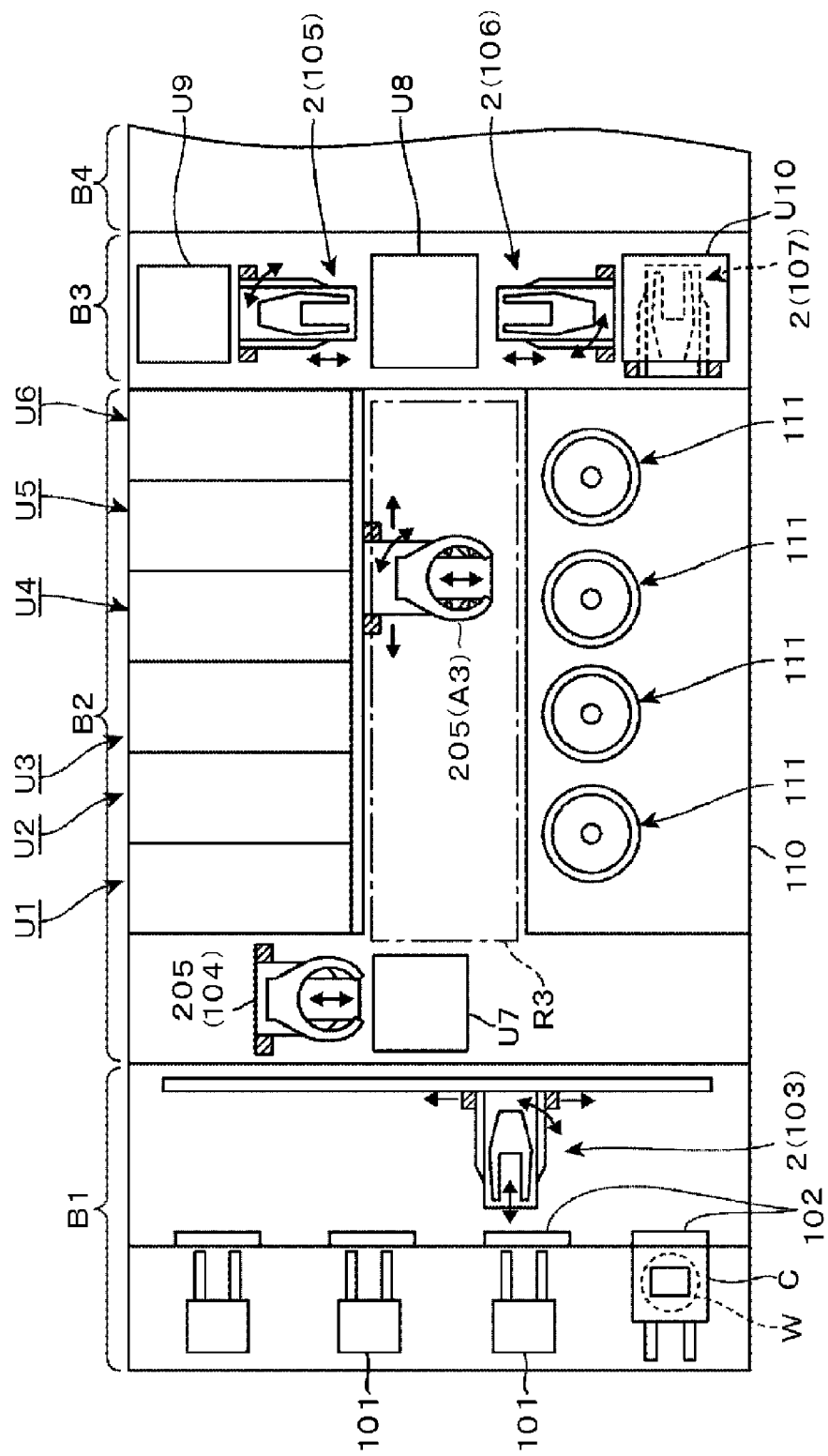
FIG. 17 is a plan view illustrating an application and development apparatus.

Subsequently, descriptions will be made on an application and development apparatus provided with the transfer arm 2 described above. The application and development apparatus is configured by linearly connecting a carrier block B1, a processing block B2, and an interface block B3 as illustrated in FIGS. 16 and 17. The interface block B3 is also connected to an exposure station B4.

The carrier block B1 has a role of carrying in/out the wafer W, which is a substrate and has a diameter of, for example, 300 mm, from a carrier C (e.g., FOUP), which is a transfer container in which a plurality of wafers W is accommodated, to the apparatus, and includes a placing stage 101 of the carrier C, a door 102, and the transfer arm 2 (103) configured to transfer the wafer W from the carrier C.

The processing block B2 is configured by stacking first to sixth unit blocks D1 to D6 configured to perform liquid treatment on the wafer W in order from the bottom, and the respective unit blocks D1 to D6 have substantially the same configuration except that a processing liquid supplied to the wafer W in a liquid treatment unit 110 (to be described later) is different.

The configuration of the unit block D3 is representatively illustrated in FIG. 17, and the unit block D3 is provided with a transfer arm 205 (A3) that is moved in a rectangular transfer region R3 directed from the carrier block B1 side to the interface block B3, and the liquid treatment unit 110 including cup modules 111, and configured to supply, for example, a resist liquid to the wafer W. The liquid treatment unit 110 supplies the processing liquid, here, the resist liquid toward the rotating wafer W using, for example, the cup module 111, and spreads the resist liquid and forms an application film on the surface of the wafer W.

The processing liquid that becomes a resist film is applied to the wafer W in the liquid treatment unit 110 in the unit blocks D1 to D3, and a development liquid is supplied to the wafer W to perform a development processing in the liquid unit 110 in the unit blocks D4 to D6. Further, heat treatment devices are stacked on shelf units U1 to U6. A shelf unit U7 configured by a plurality of modules stacked with each other is provided on the carrier block B1 side of the transfer region R3. The delivery of the wafer W between the transfer arm 2 (103) and the transfer arm 205 (A3) is performed via a delivery module of the shelf unit U7 and the transfer arm 205 (104).

The interface block B3 performs the delivery of the wafer W between the processing block B2 and the exposure station B4, and is provided with shelf units U8, U9, and U10 in which a plurality of processing modules is stacked with each other. Further, reference numerals 105 and 106 in FIG. 17 indicate the transfer arm 2 configured to deliver the wafer W between the shelf units U8 and U9, and between the shelf units U9 and U10, and a reference numeral 107 in FIG. 17 indicates the transfer arm 2 configured to deliver the wafer W between the shelf unit U10 and the exposure station B4, respectively.

The outline of the transfer path of the wafer W in the system including the application and development apparatus and the exposure station B4 will be briefly described. The wafer W flows in the order of the carrier C→the transfer arm 2 (103)→the delivery module of the shelf unit U7→transfer arm 205 (104)→the delivery module of the shelf unit U7→the unit blocks D1 to D3→the interface block B3→the exposure station B4. Therefore, a resist film is applied to the surface of the wafer W, and further, an exposure processing is performed on the surface of the resist film. Further, the wafer W on which the exposure processing is performed is transferred to the unit blocks D4 to D6 via the interface block B3. Further, the heat treatment is performed in the unit blocks D4 to D6, and subsequently the wafer W is transferred to the liquid processing unit 110 for the development processing. Thereafter, the wafer W flows in the order of the delivery module (TRS) of the shelf unit U7→the transfer arm 2 (103)→the carrier C.

In the application and development apparatus, for example, when the processing liquid is supplied to the rotating wafer W in the liquid processing unit 110, the wafer W may be charged with static electricity due to friction between the processing liquid and the rotating wafer W. When such wafer W is delivered to the transfer arms 2 and 205 (103, 104, 105, 106, 107, and A3), it is possible to destaticize the wafer W while suppressing an excessive current from flowing momentarily.

According to the present disclosure, in the substrate transfer apparatus in which the substrate is grounded via the conductive path provided the support for the substrate and destaticized, it is possible to reliably suppress the damage to the substrate.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:
1. A substrate transfer apparatus comprising:
a non-conductive support having an upper surface that faces a substrate and is configured to support the substrate;
a mover configured to move the support and transfer the substrate;
a connector configured to connect the support and the mover while being grounded;
a conductive contact provided in a recess on the upper surface of the support, and configured to support the substrate in contact with a lower surface of the substrate such that the substrate is not brought into contact with the support; and a strip-shaped conductive path configured to connect the contact and the connector, wherein the strip-shaped conductive path is provided with a bent portion such that an interval of the strip-shaped conductive path formed by the bent portion is at least twice a width of the strip-shaped conductive path.

2. The substrate transfer apparatus according to claim 1, wherein the support includes a cover formed by a conductive member in a region separated from the contact and connected to the connector, the strip-shaped conductive path is configured to connect the contact and the cover, thereby connecting the contact and the connector, and an interval between the cover and the contact is equal to or larger than the interval of the strip-shaped conductive path formed by the bent portion.

3. The substrate transfer apparatus according to claim 1, wherein the strip-shaped conductive path is formed along the upper surface of the support and surfaces other than the upper surface, and one end portion of the strip-shaped conductive path connected to the contact is provided on the upper surface of the support.

4. The substrate transfer apparatus according to claim 3, wherein the strip-shaped conductive path is formed by a conductive member provided on the surface of the support, the strip-shaped conductive path constitutes a part of the conductive member provided on the upper surface of the support, the upper surface of the support includes a first surface and a second surface closer to the substrate than the first surface, and another portion of the conductive member is provided on the second surface, and the one end portion of the strip-shaped conductive path is provided on the first surface.

5. The substrate transfer apparatus according to claim 1, wherein the support further includes a guide configured to come into contact with a side wall of the substrate and regulate a position of the substrate with respect to the support, a conductive path connecting the guide and the connector is provided on each surface of the support and the guide, and a resistance value between the guide and the connector is higher than a resistance value between the contact and the connector.

6. A substrate transfer method comprising:

causing an upper surface of a non-conductive support to face a substrate, thereby supporting the substrate;

moving the support by a mover connected to the support via a connector that is grounded, thereby transferring the substrate;

supporting the substrate in contact with a lower surface of the substrate such that the substrate is not brought into contact with the support, by a conductive contact provided in a recess on an upper surface of the support; and transferring electric charges of the substrate to the connector via a strip-shaped conductive path provided to connect the contact and the connector, wherein the strip-shaped conductive path is provided with a bent portion such that an interval of the strip-shaped conductive path formed by the bent portion is at least twice a width of the strip-shaped conductive path.

* * * * *